(12) United States Patent
Chattopadhyay et al.

(10) Patent No.: US 11,742,253 B2
(45) Date of Patent: Aug. 29, 2023

(54) SELECTIVE MOLD PLACEMENT ON INTEGRATED CIRCUIT (IC) PACKAGES AND METHODS OF FABRICATING

(71) Applicant: QUALCOMM Incorporated, San Diego, CA (US)

(72) Inventors: Sayok Chattopadhyay, San Diego, CA (US); Rajneesh Kumar, San Diego, CA (US); Srikanth Kulkarni, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 111 days.

(21) Appl. No.: 17/110,837

(22) Filed: Dec. 3, 2020

(65) Prior Publication Data

US 2021/0351096 A1 Nov. 11, 2021

Related U.S. Application Data

(60) Provisional application No. 63/021,908, filed on May 8, 2020.

(51) Int. Cl.
*H01L 23/31* (2006.01)
*H01L 23/495* (2006.01)
(Continued)

(52) U.S. Cl.
CPC ...... *H01L 23/3121* (2013.01); *H01L 21/4853* (2013.01); *H01L 21/565* (2013.01); *H01L 21/78* (2013.01); *H01L 23/49541* (2013.01)

(58) Field of Classification Search
CPC ............. H01L 23/3121; H01L 21/4853; H01L 21/565; H01L 21/78; H01L 23/49541
(Continued)

(56) References Cited

U.S. PATENT DOCUMENTS 5,347,428 A * 9/1994 Carson .................. H05K 7/023
  361/728
5,844,307 A * 12/1998 Suzuki ................ H01L 23/3121
  257/690

(Continued)

FOREIGN PATENT DOCUMENTS

| CN | 102237342 A | 11/2011 |
|---|---|---|
| WO | 2017160231 A1 | 9/2017 |
| WO | 2017171831 A1 | 10/2017 |

OTHER PUBLICATIONS

International Search Report and Written Opinion for International Patent Application No. PCT/US2021/030113, dated Aug. 13, 2021, 15 pages.

*Primary Examiner* — Vu A Vu
(74) *Attorney, Agent, or Firm* — Withrow & Terranova, PLLC (57) ABSTRACT

An integrated circuit (IC) package that is to be incorporated into a computing device may include a metallization structure with circuits and/or other elements such as capacitors or inductors thereon. Pads for input/output (I/O) (or other) purposes may also be present at different locations on the metallization structure. Exemplary aspects of the present disclosure allow mold material to be placed over the circuits and/or other elements in readily-customizable configurations so as to allow placement of the I/O pads in any desired location on the metallization structure. Specifically, before the mold material is applied to the metallization structure, a mask material such as tape may be applied to portions of the metallization structure that contain I/O pads or otherwise have reasons to not have mold material thereon. The mold material is applied, and the mask material is removed, taking unwanted mold material with the mask material.

27 Claims, 9 Drawing Sheets

(51) Int. Cl.
*H01L 21/78* (2006.01)
*H01L 21/56* (2006.01)
*H01L 21/48* (2006.01)

(58) Field of Classification Search
USPC .......................................................... 257/668
See application file for complete search history.

(56) References Cited

U.S. PATENT DOCUMENTS

| | | | | |
|---|---|---|---|---|
| 6,320,251 B1 * | 11/2001 | Glenn | ................... | H01L 25/105 |
| | | | | 257/E23.048 |
| 6,599,768 B1 * | 7/2003 | Chen | ....................... | H01L 24/97 |
| | | | | 362/249.01 |
| 7,355,289 B2 * | 4/2008 | Hess | ....................... | H01L 24/49 |
| | | | | 257/E23.101 |
| 7,752,751 B2 * | 7/2010 | Kapusta | ................. | C23C 14/046 |
| | | | | 427/96.4 |
| 7,777,348 B2 * | 8/2010 | Kodama | ................. | H01L 24/06 |
| | | | | 257/723 |
| 7,790,500 B2 * | 9/2010 | Ramos | ................... | H01L 24/48 |
| | | | | 257/676 |
| 8,097,956 B2 * | 1/2012 | von Kaenel | ...... | H01L 23/49816 |
| | | | | 257/777 |
| 8,338,928 B2 * | 12/2012 | Chen | ..................... | H01L 23/495 |
| | | | | 438/109 |
| 8,604,614 B2 * | 12/2013 | Kwon | ............... | H01L 23/49838 |
| | | | | 257/737 |
| 8,664,040 B2 * | 3/2014 | Yu | ........................... | H01L 23/31 |
| | | | | 257/E21.007 |
| 8,824,165 B2 * | 9/2014 | Chen | ..................... | H05K 1/181 |
| | | | | 336/200 |
| 8,994,165 B2 * | 3/2015 | Oi | ......................... | H01L 25/072 |
| | | | | 257/693 |
| 9,099,326 B2 * | 8/2015 | Kim | ..................... | H01L 25/0652 |
| 9,559,075 B1 | 1/2017 | Baloglu et al. | | |
| 9,597,607 B2 * | 3/2017 | Bdeir | ..................... | A63H 33/26 |
| 10,304,759 B2 * | 5/2019 | Lam | ................... | H01L 23/49541 |
| 10,985,109 B2 * | 4/2021 | Kim | ................... | H01L 23/3121 |
| 2007/0228947 A1 * | 10/2007 | Tanimoto | ................. | F21K 9/00 |
| | | | | 313/506 |
| 2015/0118802 A1 | 4/2015 | Low et al. | | |
| 2016/0148861 A1 * | 5/2016 | Liang | ..................... | H01L 24/03 |
| | | | | 257/676 |
| 2020/0135606 A1 | 4/2020 | Pan et al. | | |

* cited by examiner

SELECTIVE MOLD PLACEMENT ON INTEGRATED CIRCUIT (IC) PACKAGES AND METHODS OF FABRICATING

PRIORITY CLAIM

The present application claims priority to U.S. Provisional Patent Application Ser. No. 63/021,908 filed on May 8, 2020 and entitled "SELECTIVE MOLD PLACEMENT ON PACKAGES AND METHODS OF FABRICATING," the contents of which is incorporated herein by reference in its entirety.

BACKGROUND

I. Field of the Disclosure

The technology of the disclosure relates generally to placing mold material over elements on a metallization structure such as a printed circuit board (PCB) where the elements can be integrated circuit (IC) chips, active elements, passive elements, wafers, or the like.

II. Background

Computing devices may use a variety of integrated circuits (ICs), inductors, capacitors, dies, and the like to achieve the desired functionality. In many instances, such elements are formed into packages encapsulated in a mold material to protect the elements when installed in a computing device. The mold material may further assist in pick-and-place operations, provide a thermally-conductive path to assist in heat dissipation, or perform other functions. As package size continues to decrease, there are increased challenges in providing pads for signal input/output (I/O), testing purposes, thermal purposes, power I/O purposes, or the like in desired geometries while also providing mold material over the elements to be protected.

SUMMARY OF THE DISCLOSURE

Aspects disclosed in the detailed description include selective mold placement on integrated circuit (IC) packages and methods of fabricating the same. An IC package that is to be incorporated into a computing device may include a metallization structure with circuits and/or other elements such as capacitors or inductors thereon. Pads for input/output (I/O) (or other) purposes may also be present at different locations on the metallization structure. Exemplary aspects of the present disclosure allow mold material to be placed over the circuits and/or other elements in readily-customizable configurations so as to allow placement of the I/O pads in any desired location on the metallization structure. Specifically, before the mold material is applied to the metallization structure, a mask material such as tape may be applied to portions of the metallization structure that contain I/O pads or otherwise have reasons to not have mold material thereon. The mold material is applied, and the mask material is removed, taking unwanted mold material with the mask material. The improved flexibility of mold placement allows for greater I/O pad placement flexibility, which, in turn, provides additional design options.

In this regard in one aspect, an IC package is disclosed. The IC package includes a mold material attached to a metallization structure, the mold material having at least three sides perpendicular to the metallization structure. Each of the at least three sides has a respective pad positioned adjacent thereto.

In another aspect, an IC package is disclosed. The IC package includes a component positioned on a metallization structure. The IC package also includes a mask remainder positioned on the metallization structure. The IC package also includes a mold material positioned over the mask remainder.

In another aspect, a method for fabricating an IC package is disclosed. The method includes attaching a component to a metallization structure. The method also includes creating at least one pad on the metallization structure. The method also includes attaching a mask material over the at least one pad. The method also includes flowing a mold material over the component and the mask material. The method also includes cutting the mold material proximate an edge of the mask material. The method also includes removing a portion of the mask material along the cut with any mold material above the mask material so as to expose the at least one pad.

In another aspect, a process for fabricating an IC package is disclosed. The process includes attaching a mask material over at least one pad on a metallization structure. The process also includes flowing a mold material over the mask material. The process also includes cutting the mold material proximate an edge of the mask material. The process also includes removing the mask material along with any mold material above the mask material so as to expose the at least one pad.

In another aspect, an IC package is disclosed. The IC package includes a metallization structure. The IC package also includes a component positioned on the metallization structure. The IC package also includes a mold material covering the component, the mold material attached to the metallization structure and having at least three sides perpendicular to the metallization structure. The IC package also includes at least three pads on the metallization structure, the at least three pads not covered by the mold material and respective ones of the at least three pads positioned adjacent to respective ones of the at least three sides.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include selective mold placement on integrated circuit (IC) packages and methods of fabricating the same. An IC package that is to be incorporated into a computing device may include a metallization structure with circuits and/or other elements such as capacitors or inductors thereon. Pads for input/output (I/O) (or other) purposes may also be present at different locations on the metallization structure. Exemplary aspects of the present disclosure allow mold material to be placed over the circuits and/or other elements in readily-customizable configurations so as to allow placement of the I/O pads in any desired location on the metallization structure. Specifically, before the mold material is applied to the metallization structure, a mask material such as tape may be applied to portions of the metallization structure that contain I/O pads or otherwise have reasons to not have mold material thereon. The mold material is applied, and the mask material is removed, taking unwanted mold material with the mask material. The improved flexibility of mold placement allows for greater I/O pad placement flexibility, which, in turn, provides additional design options.

Figure 1A:
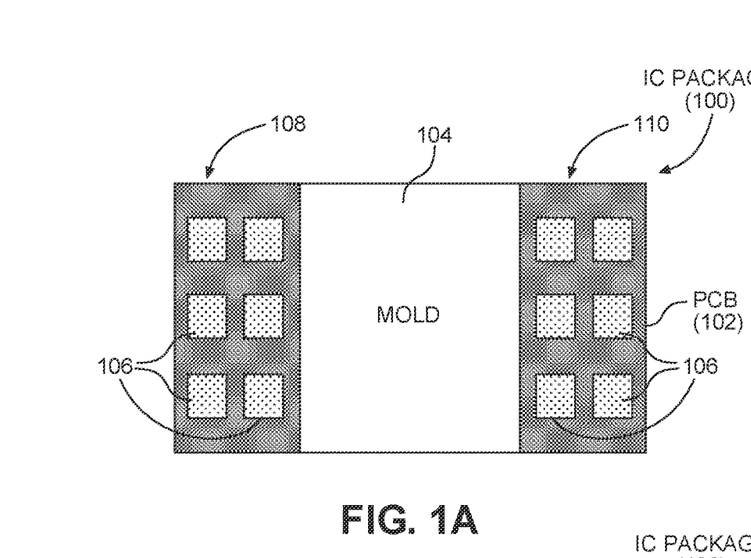
FIG. 1A is a top plan view of a conventional integrated circuit (IC) package having a mold material over a portion of a metallization structure such as a printed circuit board (PCB) and having pads for input/output (I/O) purposes exposed on either side of the mold material.
Figure 1B:
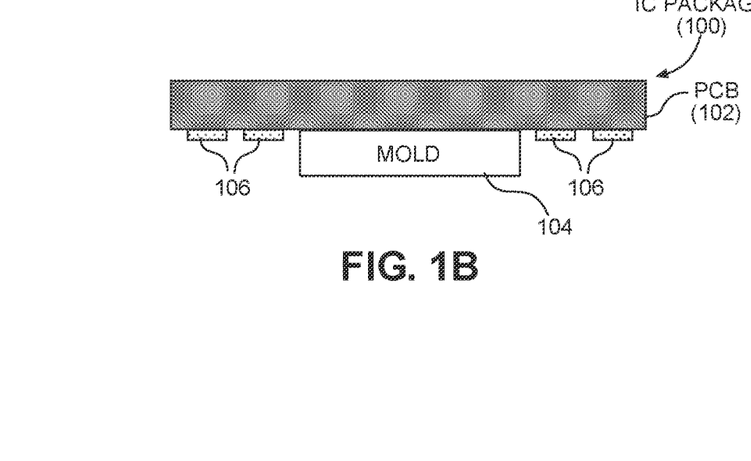
FIG. 1B is a side elevational view of the IC package of FIG. 1A.

Before addressing selective mold placement on IC packages according to exemplary aspects of the present disclosure, a brief review of conventional packaging and conventional mold placement is provided with reference to FIGS. 1A and 1B. The selective mold placement on IC packages according to the present disclosure is discussed below beginning with reference to FIG. 2A.

In this regard, FIG. 1A is top plan view of an IC package 100 having a metallization or support structure such as a PCB 102 on which a mold material 104 is positioned. The mold material 104 covers and protects any of a variety of possible elements such as an IC, inductor, capacitor, active element, passive element, or the like. The mold material 104 may be a plastic and may be used to dissipate heat as well as provide electrical insulation for elements underneath the mold material 104. The IC package 100 further includes a plurality of pads for I/O or other purposes, referred to herein as I/O pads 106, with the understanding that these pads may not strictly be limited to I/O purposes. The plurality of I/O pads 106 may be arranged on either side 108 or 110 of the mold material 104.

In use, as better seen in FIG. 1B, the IC package 100 may be positioned so that the I/O pads 106 are on a bottom side 112 of the PCB 102 and ready to be coupled to complementary connectors on a system board within a computing device (not shown). In a further aspect, the mold material 104 may fit within a recess in such a system board.

In practice, most conventional flow molding techniques only allow pads (e.g., I/O pads 106) to be positioned on either side (or both sides) of the mold material 104. As package size continues to decrease, and pad counts continue to increase (particularly with the advent of 5G telecommunication), limiting the areas where pads may be placed may be unacceptable.

There is a molding technique called top gate molding that allows forming a mold structure that allows pads to be positioned on more than two sides of the mold material (see, for example, U.S. Patent Application Publication No. 2015/0118802 assigned to NXP USA, Inc.). However, top gate molding techniques create a draft angle (i.e., the angle between the horizontal substrate and the vertical molding material) that is not a right angle (i.e., ninety degrees). Typically such draft angles exceed ten degrees from true vertical (e.g., less than eighty degrees or more than one hundred degrees depending on from which side the measurement is made). This angle facilitates ejection of the molding material from the mold die. However, even with this angle, top gate molding typically requires an ejector pin and may leave sprues of mold or mold flash.

Accordingly, exemplary aspects of the present disclosure provide for a manufacturing process that allows pads to be placed on at least three sides of mold material in an IC package such that different pad configurations are possible without requiring a top gate molding process. Accordingly, the draft angle is closer to a true ninety degrees and there are no mold sprues or mold flash. Further, an ejector pin is not required. For example, exemplary aspects of the present disclosure allow a package such as IC package 200 illustrated in FIGS. 2A and 2B to be made through a high volume manufacturing (HVM) process while providing I/O pads 202 adjacent to more than two sides (i.e., at least three) of a mold material 204. Thus, in addition to being on a first side 206 and a second side 208 of a metallization structure such as a PCB 210, the I/O pads 202 may also be positioned on a third side 212 and a fourth side 214. As shown in FIG. 2B, this flexibility is made possible by a mask material 216, a residue of which remains along an exterior edge of the mold material 204. A draft angle 218 is formed between the metallization structure and the sides of the mold material 204. The draft angle 218 is a right angle and thus may be considered formed by elements that are perpendicular to one another (i.e., the sides of the mold material are perpendicular to the metallization structure). "Perpendicular" is defined herein to be within five degrees of a true ninety-degree angle (e.g., 85-95 degrees). Note that "adjacent" is defined herein to be proximate to, but not necessarily abutting. Thus, the I/O pads 202A within the dotted box of the third side 212 are adjacent to a third side 217 of the mold material 204, while pads 202B are not adjacent to third side 217, but would be considered adjacent to side 219 of the mold material 204.

Figure 3:
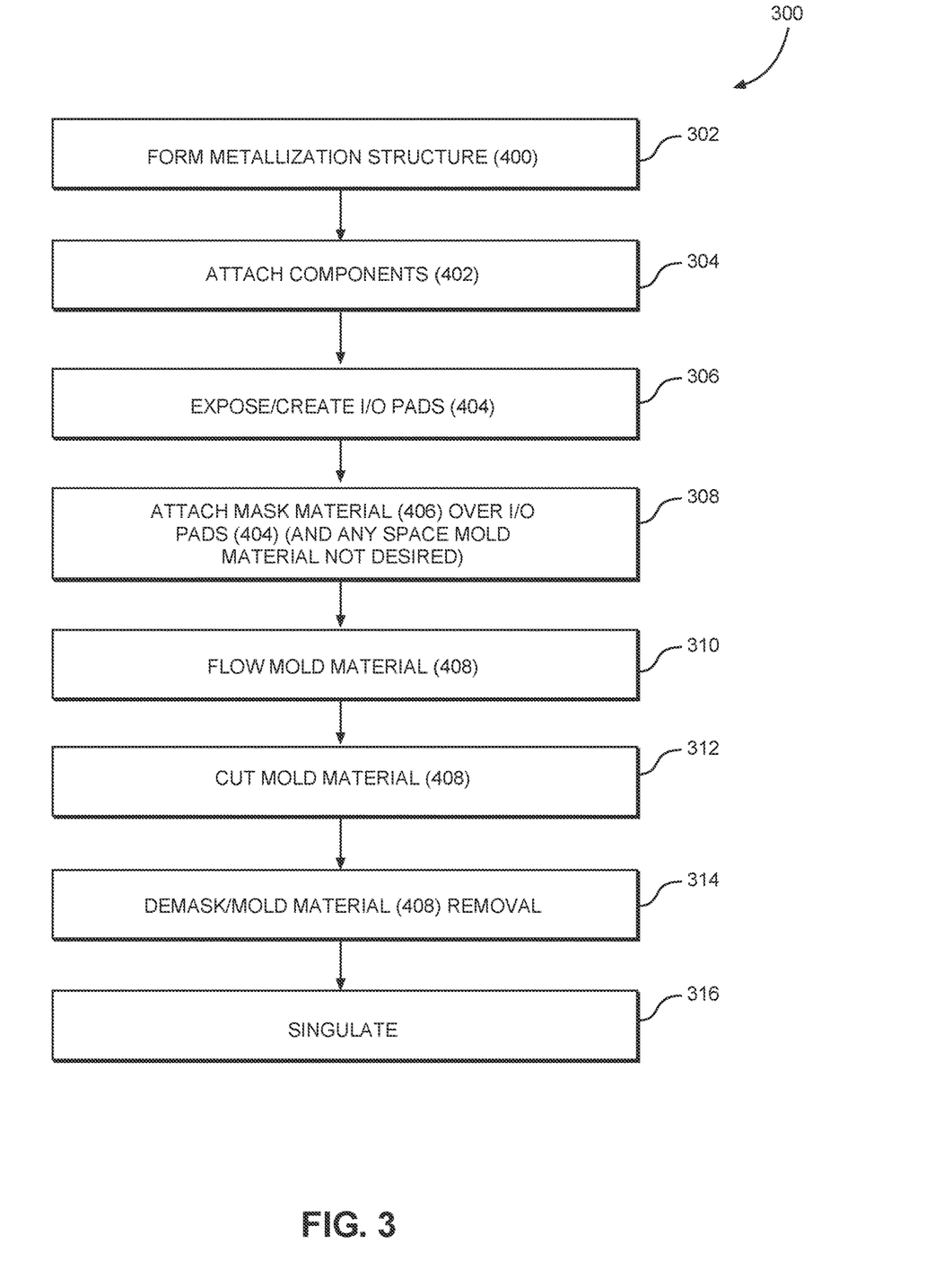
FIG. 3 is a flowchart illustrating an exemplary process for fabricating the IC package of FIGS. 2A and 2B with a mask to remove portions of the mold material.

With reference to FIG. 3, a review of a process 300 for making the IC package 200 may be helpful in understanding the flexibility of the process. Reference is also made to FIGS. 4A-4F to assist in understanding the process 300. In this regard, the process 300 begins by forming a metallization structure 400 (block 302, see fabrication stage 401A of FIG. 4A). The metallization structure 400 may be a PCB, an organic PCB, or other material as is well understood. The metallization structure 400 may be large enough to make a plurality of IC packages according to the present disclosure. Components 402 are attached to the metallization structure 400 (block 304, see FIG. 4A) such as by surface mounting technology (SMT). In an exemplary aspect, the components 402 may include one or more of a die, a chip, a wafer, an inductor, a capacitor, a passive component, an active component, or the like. Additionally, I/O pads 404 may be created or exposed in portions of the metallization structure 400 (block 306, see FIG. 4A).

Figure 4A:
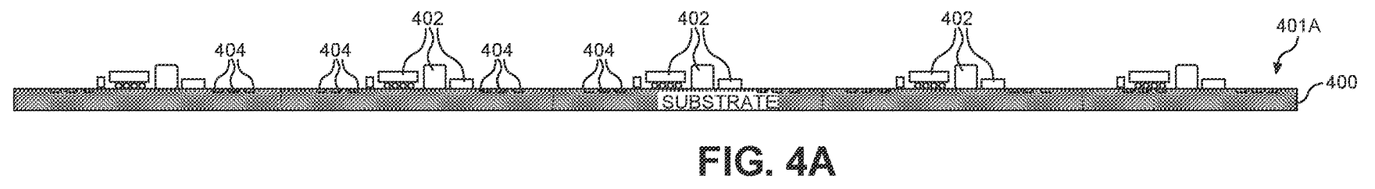
FIGS. 4A-4F illustrate various steps of the process of FIG. 3.
Figure 4B:
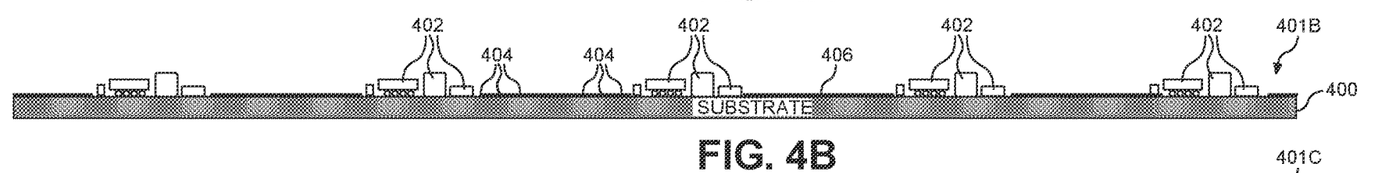

With continued reference to FIG. 3, the process 300 continues by attaching a mask material 406 over any I/O pads 404 as well as any space on the metallization structure 400 where mold material is not desired (block 308, see fabrication stage 401B of FIG. 4B). In an exemplary aspect, the mask material 406 may be a tape material such as an epoxy-based tape material or a silicone-based adhesive tape material.

Figures 4C, 4D, 4E, 4F:
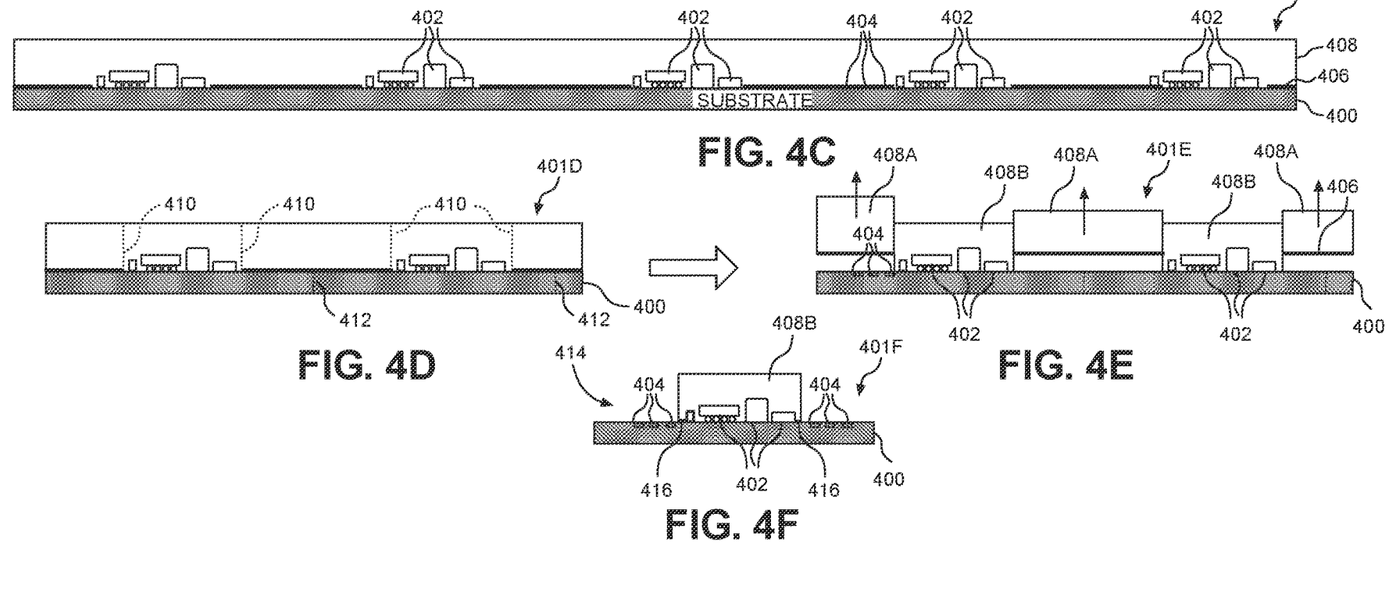

Once the mask material 406 is secured, a mold material 408 may be applied such as through flowing the mold material 408 (block 310, see fabrication stage 401C of FIG. 4C). As noted above, the mold material 408 may be a plastic material that flows freely and can surround and encapsulate the components 402. The mold material 408 may further be thermally conductive to assist in heat dissipation, while also being an electrical insulator to avoid inadvertent shorts.

The mold material 408 may be cut (block 312, see fabrication stage 401D of FIG. 4D) along dotted lines 410. This cut may be made after an initial partial cure such as that which occurs in a molding machine or after curing in an oven. Dotted lines 412 represent boundaries of different mold encapsulations being formed on the metallization structure 400. Once the cuts along the dotted lines 410 are made, the mold material 408A in places above the mask material 406 may be removed (block 314, see fabrication stage 401E of FIG. 4E) leaving mold material 408B in place as an overmold for the components 402 embedded therein. Further, the I/O pads 404 are now exposed by removal of the mold material 408A. Finally, the IC packages may be singulated (block 316, see fabrication stage 401F of FIG. 4F) leaving individual IC packages 414 having exposed I/O pads 404 and components 402 embedded in the remaining mold material 408B. It should be appreciated that there is likely to be some small residual mask material 416 (also referred to herein as a mask reminder) at the edges of the remaining mold material 408B. Depending on the size of the IC package, this residual material may be a few nanometers to a few micrometers.

Figure 2A:
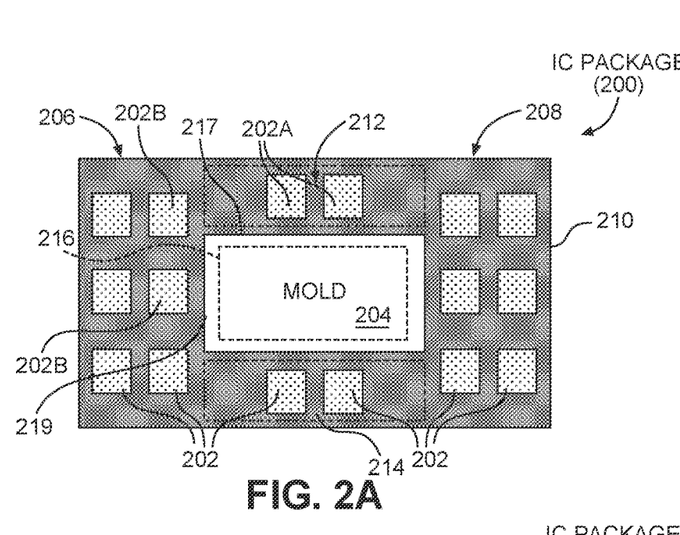
FIG. 2A is a top plan view of an IC package having mold material over a portion of a metallization structure such as a PCB, while having pads for I/O purposes on at least three sides of the mold material.
Figure 2B:
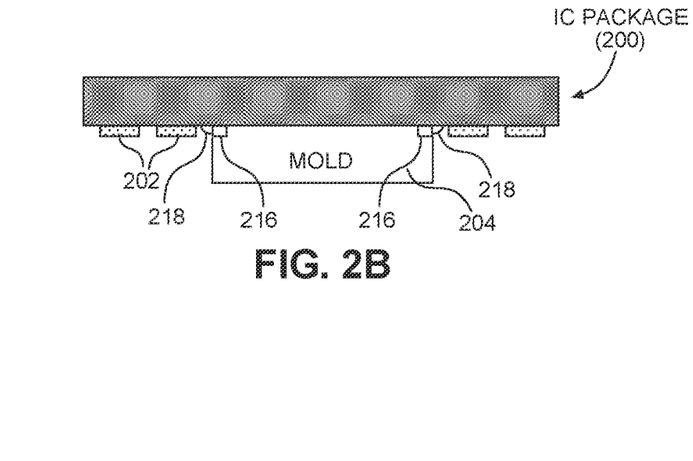
FIG. 2B is a side elevational view of the IC package of FIG. 2A, showing tape remainder after the IC package is fabricated according to exemplary aspects of the present disclosure.
Figure 5A:
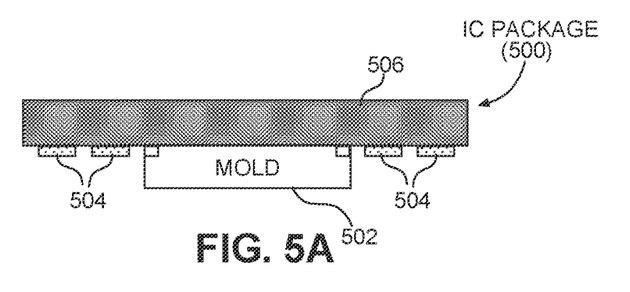
FIGS. 5A-5C illustrate various IC package configurations on a metallization structure including one-sided, two-sided with one customized mold material, and two-sided with both sides being customized.
Figure 5B:
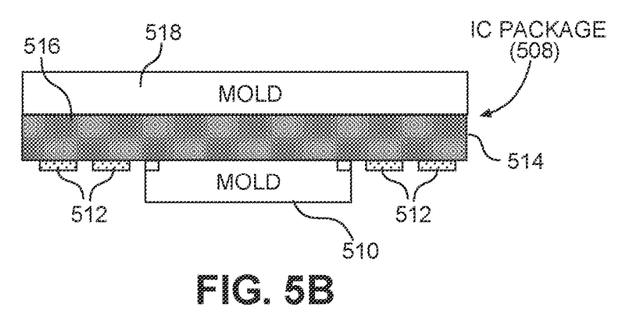
Figure 5C:
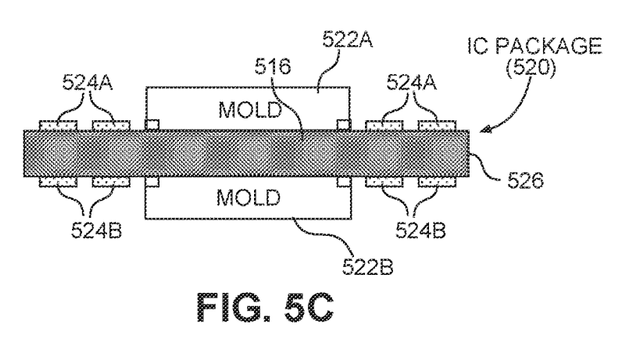

While the IC package 200 of FIG. 2 and the IC package 414 of FIG. 4F are one-sided in that the components and mold material only appear on one face of the PCB, it should be appreciated that the present disclosure is not so limited. Rather, as shown in FIGS. 5A-5C, a variety of configurations are possible. Thus, FIG. 5A illustrates an IC package 500 with a mold material 502 and I/O pads 504 on a lower surface of a metallization structure such as a PCB 506, leaving the upper surface "clean" of further components, mold material, or I/O pads. In contrast, FIG. 5B illustrates an IC package 508 with a mold material 510 and I/O pads 512 on a lower surface of a metallization structure such as a PCB 514, but an upper surface 516 is completely covered with a mold material 518 with no I/O pads. Inside the mold material 518 may be a variety of components (not shown). A third variation is shown in FIG. 5C where an IC package 520 has a mold material 522A, 522B and I/O pads 524A, 524B on both sides of a metallization structure such as a PCB 526, respectively. Another variation, not shown, would be similar to the IC package 508, but instead of the upper surface 516 being completely covered by the mold material 518, there is no mold material at all, but instead, a plurality of I/O pads are positioned on the upper surface 516.

Figure 6A:
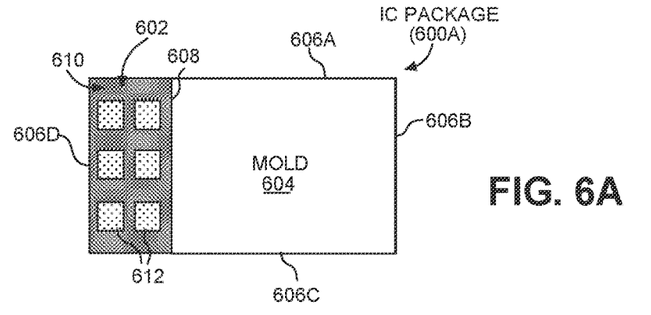
FIGS. 6A-6F illustrate various possible configurations for mold material on a side of a metallization structure.

While the IC package 200 of FIG. 2A showed I/O pads 202 on four sides around a perimeter of the mold material 204, the present disclosure is not limited to such. Rather, as illustrated in FIGS. 6A-6F, a variety of configurations are possible through the use of a mask as described in the process 300. For example, as shown in FIG. 6A, an IC package 600A includes a metallization structure 602 partially covered by a mold material 604. The mold material 604 extends to edges 606A-606C of the metallization structure 602. However, the mold material 604 has a first mold edge 608, which does not extend to edge 606D of the metallization structure 602. In the exposed portion 610 of the metallization structure 602, I/O pads 612 are provided for the IC package 600A. Thus, in the IC package 600A, the I/O pads 612 are provided adjacent to only one edge of the mold material 604.

Figure 6B:
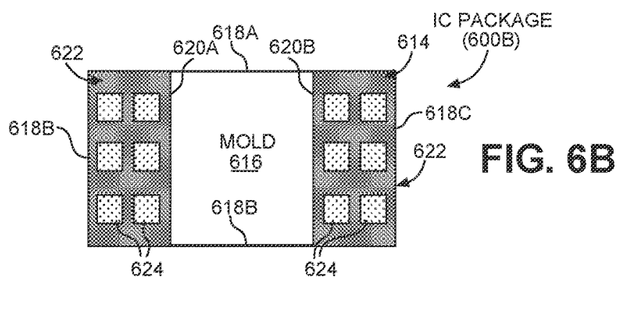

FIG. 6B illustrates an IC package 600B, with a metallization structure 614 partially covered by a mold material 616. The mold material 616 extends to edges 618A and 618B of the metallization structure 614. However, the mold material 616 has a two mold edges 620A and 620B, which do not extend to edges 618C or 618D of the metallization structure 614. In the exposed portions 622 of the metallization structure 614, I/O pads 624 are provided for the IC package 600B. Thus, in the IC package 600B, the I/O pads 624 are provided adjacent to two edges of the mold material 616.

Figure 6C:
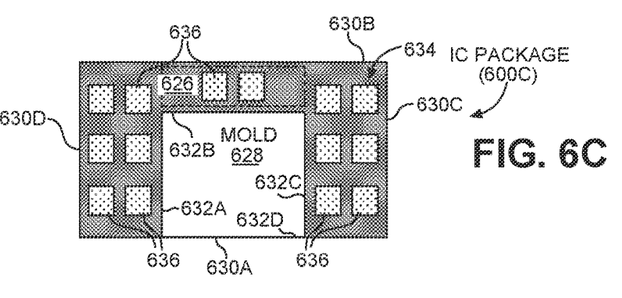

FIG. 6C illustrates an IC package 600C, with a metallization structure 626 partially covered by a mold material 628. The mold material 628 extends to only one edge 630A of the metallization structure 626. However, the mold material 628 has three mold edges 632A-632C, which do not extend to the edges 630B-630D of the metallization structure 626. In the exposed portion 634 of the metallization structure 626, I/O pads 636 are provided for the IC package 600C. Thus, in the IC package 600C, the I/O pads 636 are provided adjacent to only three edges of the mold material 628.

Figure 6D:
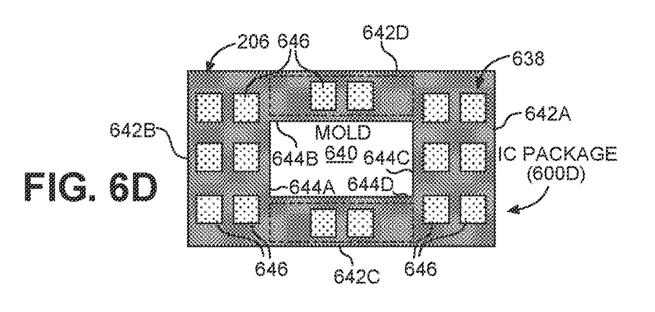

FIG. 6D illustrates an IC package 600D with a metallization structure 638 partially covered by a mold material 640. The mold material 640 does not touch any of the edges 642A-642D of the metallization structure 638. That is, all edges 644A-644D of the mold material 640 are spaced from the edges 642A-642D such that I/O pads 646 are provided all around the mold material 640.

Figure 6E:
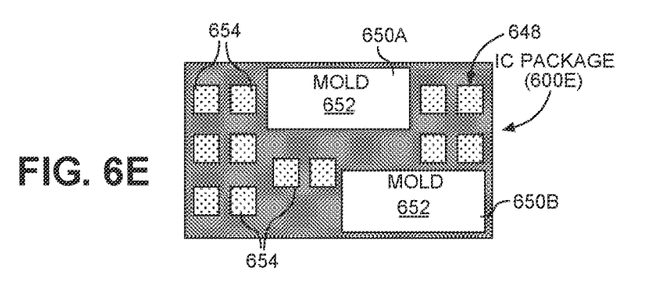

FIG. 6E illustrates an IC package 600E that includes a metallization structure 648 having two areas 650A and 650B covered by a mold material 652. The mold material 652 may be adjacent an edge of the metallization structure 648, but need not be. I/O pads 654 may be positioned on any exposed portion of the metallization structure 648.

Figure 6F:
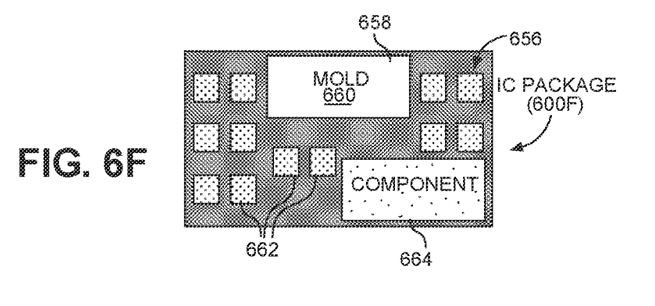

FIG. 6F illustrates an IC package 600F that includes a metallization structure 656 with one area 658 covered by a mold material 660. In addition to I/O pads 662 on the exposed portion of the metallization structure 656, an additional component 664 may be mounted on the exposed portion of the metallization structure 656.

It should be appreciated that the use of a mask material to remove mold material provides great flexibility in the placement of the mold material and the shape of the space available for I/O pads. As seen with the IC package 600F, this space may also be used for other components that are not intended to be under the mold material.

Figure 7A:
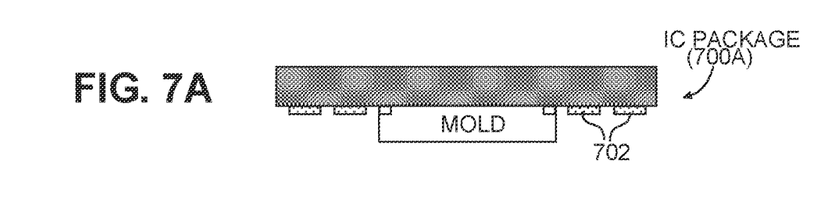
FIGS. 7A-7E illustrate various connection types that may benefit from the various configurations for mold material.
Figure 7B:
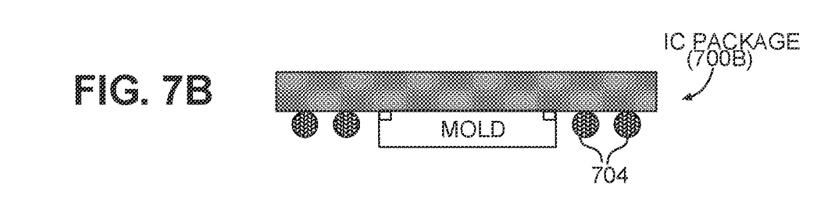
Figure 7C:
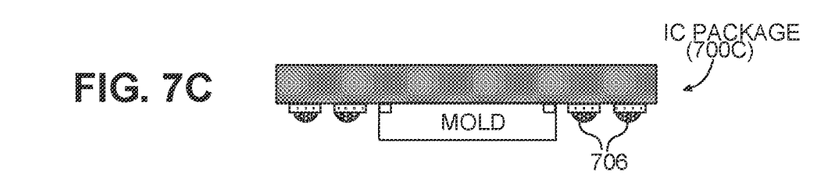
Figure 7D:
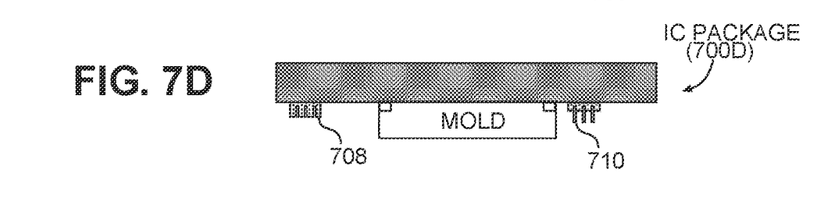

While the previous figures contemplate basic pads as the I/O pads, the present disclosure is not so limited. As seen FIGS. 7A-7D, a variety of connectors may be present in IC packages 700A-700D, and placement of such various connectors is limited only by the constraints of the ability to cut and remove the mold material. It is again appropriate to also note that while the pads are usually referred to herein as I/O pads, the pads may be used for other purposes besides signal paths. As noted, the pads may be used for testing purposes, thermal purposes, power I/O purposes, or the like. Turning now to FIG. 7A, connectors 702 in FIG. 7A may be land grid array (LGA) connectors. Connectors 704 in FIG. 7B may be ball grid array (BGA) connectors. Note that the balls may be applied to the IC package 700B after removal of the mask material. Connectors 706 in FIG. 7C may be solder on pad (SOP) connectors. Note that the solder may be applied to the IC package 700C before molding or after removal of the mask material. Connectors 708 and 710 in FIG. 7D may be female or male connectors, respectively. Again, note that the connectors may be applied to the IC package 700D after removal of the mask material. While some specific connectors are illustrated in FIGS. 7A-7D, other connectors may be used without departing from the present disclosure.

Figure 7E:
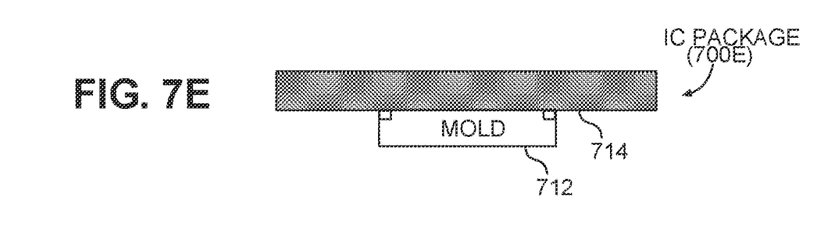

FIG. 7E illustrates a special case, where an IC package 700E has no pads. However, a mold material 712 covers a component (not shown) on a metallization structure 714 and may be shaped to fit within a specific recess on a system board or for other reasons. Alternatively and non-exclusively, the shape of the mold may be made to assist in pick-and-place processes including being used to orient the package for placement or the like.

Figure 8A:
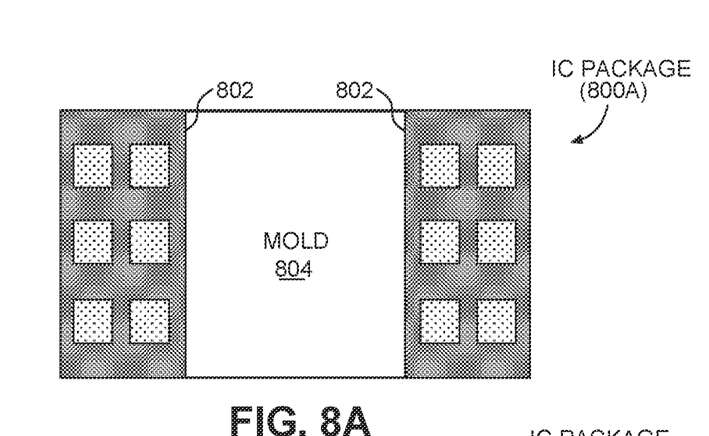
FIGS. 8A-8C illustrate the flexibility to provide different mold configurations using straight or non-linear edges as well as discontinuous mold material.
Figure 8B:
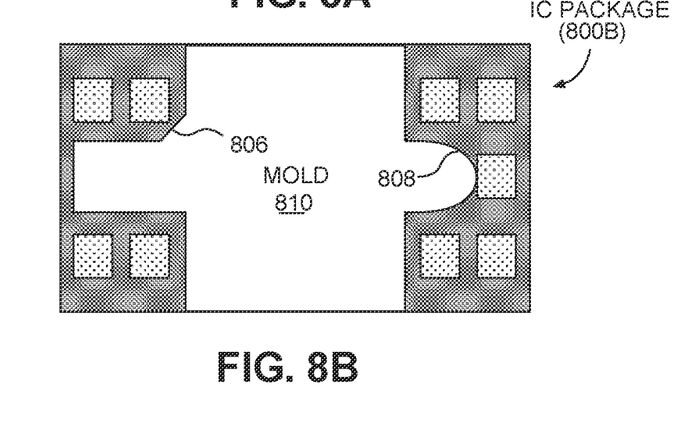
Figure 8C:
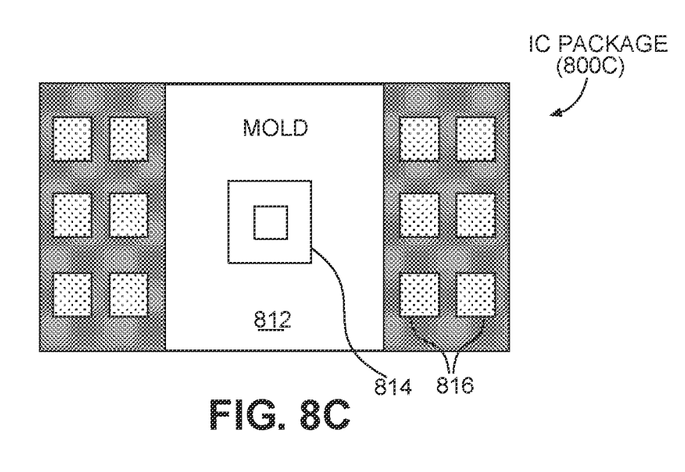

FIGS. 8A-8C illustrate further flexibility of the mask material of the present disclosure. For example, in FIG. 8A, the mask material may be used to make straight edges 802 for a mold material 804 in an IC package 800A. In contrast, the mask material may be used to make generally rectilinear shapes, curves, arcuate edges, slants, ellipsoids, or other shapes as illustrated by edges 806, 808 for a mold material 810 in an IC package 800B as illustrated in FIG. 8B. FIG. 8C illustrates an IC package 800C with an annular- or donut-shaped mold material 812 with a pad 814 positioned inside the area exposed in the center as well as pads 816 outside the mold material 812. Again, the flexibility of the present disclosure allows different shapes and placement as needed or desired.

The IC packages with selective mold placement made according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
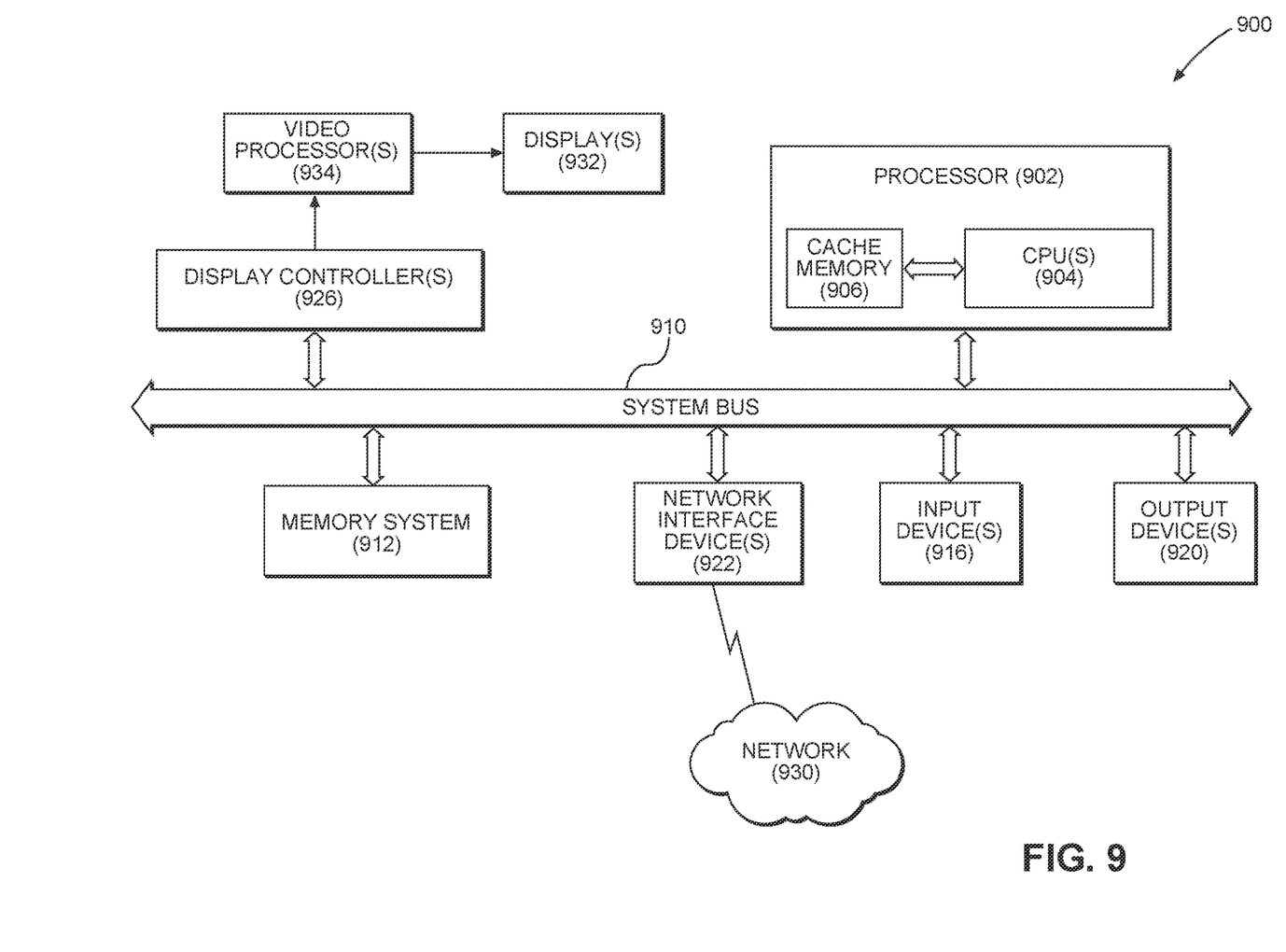
FIG. 9 is a block diagram of an exemplary processor-based system that can include the IC packages of FIGS. 2A, 2B, 4A-4F, 5A-5C, 6A-6F, 7A-7E, and 8A-8C.

In this regard, FIG. 9 illustrates an example of a processor-based system 900 that can include IC packages such as those illustrated in FIGS. 2A, 2B, 4A-4F, 5A-5C, 6A-6F, 7A-7E, and 8A-8C. In this example, the processor-based system 900 includes a processor 902 that includes one or more central processing units (CPUs) 904. The processor 902 may have cache memory 906 coupled to the CPU(s) 904 for rapid access to temporarily stored data. The processor 902 is coupled to a system bus 910 and can intercouple master and slave devices included in the processor-based system 900. As is well known, the processor 902 communicates with these other devices by exchanging address, control, and data information over the system bus 910. Although not illustrated in FIG. 9, multiple system buses 910 could be provided, wherein each system bus 910 constitutes a different fabric. For example, the processor 902 can communicate bus transaction requests to a memory system 912 as an example of a slave device. The memory system 912 may include memory structures or arrays that are included in IC packages such as those illustrated in FIGS. 2A, 2B, 4A-4F, 5A-5C, 6A-6F, 7A-7E, and 8A-8C.

Other master and slave devices can be connected to the system bus 910. As illustrated in FIG. 9, these devices can include the memory system 912 and one or more input devices 916. The input device(s) 916 can include any type of input device, including, but not limited to, input keys, switches, voice processors, etc. These devices can also include one or more output devices 920 and one or more network interface devices 922. The output device(s) 920 can include any type of output device, including, but not limited to, audio, video, other visual indicators, etc. These devices can also include one or more display controllers 926. The network interface device(s) 922 can be any device configured to allow exchange of data to and from a network 930. The network 930 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 922 can be configured to support any type of communications protocol desired.

The processor 902 may also be configured to access the display controller(s) 926 over the system bus 910 to control information sent to one or more displays 932. The display controller(s) 926 sends information to the display(s) 932 to be displayed via one or more video processors 934, which process the information to be displayed into a format suitable for the display(s) 932. The display(s) 932 can include any type of display, including, but not limited to, a cathode ray tube (CRT), a liquid crystal display (LCD), a plasma display, a light emitting diode (LED) display, etc.

Figure 10:
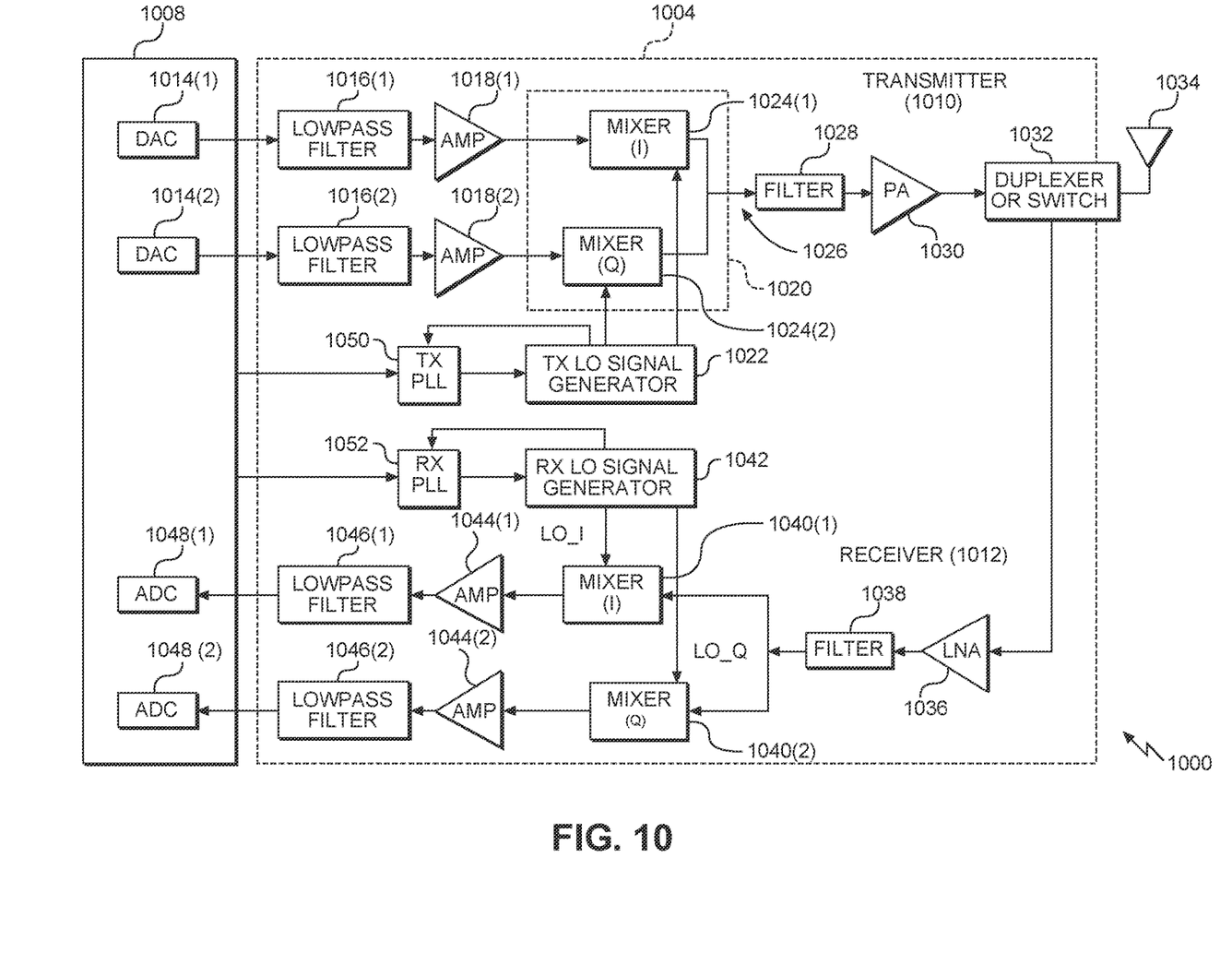
FIG. 10 is a block diagram of an exemplary wireless communications device that includes radio frequency (RF) components, wherein any of the components therein can include IC packages made according to exemplary aspects of the present disclosure.

FIG. 10 illustrates an example of a wireless communications device 1000 which can include radio frequency (RF) components provided in IC packages such as those illustrated in FIGS. 2A, 2B, 4A-4F, 5A-5C, 6A-6F, 7A-7E, and 8A-8C. The wireless communications device 1000 may include or be provided in any of the above-referenced devices, as examples. As shown in FIG. 10, the wireless communications device 1000 includes a transceiver 1004 and a data processor 1008. The data processor 1008 may include a memory (not shown) to store data and program codes. The transceiver 1004 includes a transmitter 1010 and a receiver 1012 that support bi-directional communication. In general, the wireless communications device 1000 may include any number of transmitters and/or receivers for any number of communication systems and frequency bands. All or a portion of the transceiver 1004 may be implemented on one or more analog ICs, RF ICs (RFICs), mixed-signal ICs, etc.

A transmitter 1010 or a receiver 1012 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver 1012. In the direct-conversion architecture, a signal is frequency converted between RF and baseband in one stage. The super-heterodyne and direct-conversion architectures may use different circuit blocks and/or have different requirements. In the wireless communications device 1000 in FIG. 10, the transmitter 1010 and the receiver 1012 are implemented with the direct-conversion architecture.

In the transmit path, the data processor 1008 processes data to be transmitted and provides I and Q analog output signals to the transmitter 1010. In the exemplary wireless communications device 1000, the data processor 1008 includes digital-to-analog-converters (DACs) 1014(1) and 1014(2) for converting digital signals generated by the data processor 1008 into the I and Q analog output signals, e.g., I and Q output currents, for further processing.

Within the transmitter 1010, lowpass filters 1016(1), 1016(2) filter the I and Q analog output signals, respectively, to remove undesired images caused by the prior digital-to-analog conversion. Amplifiers (AMPs) 1018(1), 1018(2) amplify the signals from the lowpass filters 1016(1), 1016(2), respectively, and provide I and Q baseband signals. An upconverter 1020 upconverts the I and Q baseband signals with I and Q transmit (TX) local oscillator (LO) signals through mixers 1024(1), 1024(2) from a TX LO signal generator 1022 to provide an upconverted signal 1026. A filter 1028 filters the upconverted signal 1026 to remove undesired images caused by the frequency upconversion as well as noise in a receive frequency band. A power amplifier (PA) 1030 amplifies the upconverted signal 1026 from the filter 1028 to obtain the desired output power level and provides a transmit RF signal. The transmit RF signal is routed through a duplexer or switch 1032 and transmitted via an antenna 1034.

In the receive path, the antenna 1034 receives signals transmitted by base stations and provides a received RF signal, which is routed through the duplexer or switch 1032 and provided to a low noise amplifier (LNA) 1036. The duplexer or switch 1032 is designed to operate with a specific RX-to-TX duplexer frequency separation, such that RX signals are isolated from TX signals. The received RF signal is amplified by the LNA 1036 and filtered by a filter 1038 to obtain a desired RF input signal. Downconversion mixers 1040(1), 1040(2) mix an output of the filter 1038 with I and Q receive (RX) LO signals (i.e., LO_I and LO_Q) from an RX LO signal generator 1042 to generate I and Q baseband signals. The I and Q baseband signals are amplified by AMPs 1044(1), 1044(2) and further filtered by lowpass filters 1046(1), 1046(2) to obtain I and Q analog input signals, which are provided to the data processor 1008. In this example, the data processor 1008 includes analog-to-digital-converters (ADCs) 1048(1), 1048(2) for converting the analog input signals into digital signals to be further processed by the data processor 1008.

In the wireless communications device 1000 in FIG. 10, the TX LO signal generator 1022 generates the I and Q TX LO signals used for frequency upconversion, while the RX LO signal generator 1042 generates the I and Q RX LO signals used for frequency downconversion. Each LO signal is a periodic signal with a particular fundamental frequency. A transmit (TX) phase-locked loop (PLL) circuit 1050 receives timing information from data processor 1008 and generates a control signal used to adjust the frequency and/or phase of the TX LO signals from the TX LO signal generator 1022. Similarly, a receive (RX) PLL circuit 1052 receives timing information from the data processor 1008 and generates a control signal used to adjust the frequency and/or phase of the RX LO signals from the RX LO signal generator 1042.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC) package comprising:
   a component
   a mold material attached to a metallization structure and covering the component, the mold material having at least three sides comprising a first side, a second side, and a third side, each of the at least three sides perpendicular to the metallization structure
   a first pad positioned adjacent to the first side;
   a second pad positioned adjacent to the second side;
   a third pad positioned adjacent to the third side such that each of the first pad, the second pad, and the third pad are not covered by the mold material; and
   a mask remainder positioned on the top surface of the metallization structure, wherein there is no mask remainder on the component or on the first pad, second pad, or third pad.

2. The IC package of claim 1, wherein the metallization structure comprises a printed circuit board (PCB).

3. The IC package of claim 1 wherein the component is selected from the group consisting of: a chip, a die, a wafer, an active component, a passive component, an inductor, and a capacitor.

4. The IC package of claim 1, wherein the mold material comprises a generally rectilinear shape.

5. The IC package of claim 1, further comprising:
   a fourth side of the mold material, wherein each of the four sides of the mold material is perpendicular to the metallization structure.

6. The IC package of claim 1, wherein the first pad comprises a land grid array (LGA) connector.

7. The IC package of claim 1, wherein the first pad comprises a ball grid array (BGA) connector.

8. The IC package of claim 1, wherein the first pad comprises a male connector.

9. The IC package of claim 1, wherein the first pad comprises a female connector.

10. The IC package of claim 1, wherein the first pad comprises a solder on pad (SOP) connector.

11. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. An integrated circuit (IC) package comprising:
    a component and pads positioned on a metallization structure having a planar top surface;
    a mask remainder positioned on the planar top surface of the metallization structure, wherein there is no mask remainder on the component or on the pads; and
    a mold material positioned over the mask remainder parallel to the planar top surface such that the mask remainder is sandwiched between the metallization structure and the mold material.

13. The IC package of claim 12, wherein the mask remainder surrounds the component.

14. The IC package of claim 12, wherein the mask remainder comprises a tape remainder.

15. A method for fabricating an integrated circuit (IC) package, the method comprising:
    attaching a component to a metallization structure;
    creating at least one pad on the metallization structure;
    attaching a mask material that comprises a tape material over the at least one pad;
    flowing a mold material over the component and the mask material;
    cutting the mold material proximate an edge of the mask material; and
    removing a portion of the mask material along the cut with any mold material above the mask material so as to expose the at least one pad.

16. The method of claim 15, further comprising providing the metallization structure.

17. The method of claim 16, wherein providing the metallization structure comprises providing a printed circuit board (PCB) as the metallization structure.

18. The method of claim 15, wherein attaching the component comprises attaching one of a chip, a die, a wafer, an active component, a passive component, an inductor, or a capacitor.

19. The method of claim 15, further comprising leaving a residual portion of the mask material under the mold material above the metallization structure after removing.

20. The method of claim 15, wherein attaching the tape material comprises attaching one of a silicone- or epoxy-based adhesive tape material.

21. The method of claim 15, further comprising singulating the metallization structure to form a plurality of IC packages.

22. The method of claim 15, wherein cutting the mold material comprises cutting along a plurality of edges.

23. The method of claim 15, wherein cutting the mold material comprises cutting a straight edge.

24. The method of claim 15, wherein cutting the mold material comprises cutting an arcuate edge.

25. The method of claim 15, wherein removing the portion of the mask material along the cut with any mold material above the mask material so as to expose the at least one pad comprises exposing pads adjacent to at least three edges of the mold material.

26. A process for fabricating an integrated circuit (IC) package, the process comprising:

providing a component and pads on a metallization structure;

attaching a mask material that comprises a tape material over at least one pad on the metallization structure, wherein the mask material is not placed on the component;

flowing a mold material over the mask material;

cutting the mold material proximate an edge of the mask material; and removing the mask material along with any mold material above the mask material so as to expose the at least one pad, wherein a portion of the mask material remains on the planar top surface of the metallization structure.

27. An integrated circuit (IC) package comprising:

a metallization structure;

a component positioned on the metallization structure;

a mold material covering the component, the mold material attached to the metallization structure and having at least three sides perpendicular to the metallization structure;

at least three pads on the metallization structure, the at least three pads not covered by the mold material and respective ones of the at least three pads positioned adjacent to respective ones of the at least three sides: and a tape remainder positioned on the top of the metallization structure, wherein there is no tape remainder on the component or on the first pad, second pad, or third pad.

\* \* \* \* \*